US009576661B2

United States Patent
Roy et al.

(10) Patent No.: US 9,576,661 B2
(45) Date of Patent: Feb. 21, 2017

(54) SYSTEMS AND METHODS FOR SRAM WITH BACKUP NON-VOLATILE MEMORY THAT INCLUDES MTJ RESISTIVE ELEMENTS

(71) Applicant: FREESCALE SEMICONDUCTOR, INC., Austin, TX (US)

(72) Inventors: Anirban Roy, Austin, TX (US); Michael A Sadd, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/716,729

(22) Filed: May 19, 2015

(65) Prior Publication Data

US 2016/0343436 A1 Nov. 24, 2016

(51) Int. Cl.
  *G11C 11/00* (2006.01)
  *G11C 14/00* (2006.01)
  *G11C 11/419* (2006.01)

(52) U.S. Cl.
  CPC ......... *G11C 14/0081* (2013.01); *G11C 11/419* (2013.01)

(58) Field of Classification Search
  None
  See application file for complete search history.

(56) References Cited

U.S. PATENT DOCUMENTS

| | | | |
|---|---|---|---|
| 7,206,217 B2* | 4/2007 | Ohtsuka | G11C 13/0004 257/E21.208 |
| 7,791,941 B2 | 9/2010 | Hanafi | |
| 8,018,768 B2 | 9/2011 | Shih et al. | |
| 8,295,079 B2* | 10/2012 | Yamamoto | G11C 14/0081 365/145 |
| 8,422,295 B1 | 4/2013 | Lin et al. | |
| 2004/0052106 A1* | 3/2004 | Ohtani | G11C 14/00 365/158 |
| 2008/0298117 A1* | 12/2008 | Hamada | G11C 5/14 365/156 |
| 2010/0073991 A1* | 3/2010 | Yamada | G11C 11/56 365/148 |

OTHER PUBLICATIONS

Fujita, et al., "Novel Nonvolatile L1/L2/L3 Cache Memory Hierarchy Using Nonvolatile-SRAM With Voltage-Induced Magnetization Switching and Ultra Low-Write-Energy MTJ", IEEE Transactions on Magnetics, vol. 49, No. 7, Jul. 2013, pp. 4456-4459.

Abe, et al., "Novel Hybrid DRAM/MRAM Design for Reducing Power of High Performance Mobile CPU", DOI: 10.1109/IEDM.2012.6479019 Conference: Electron Devices Meeting (IEDM), 2012 IEEE International, pp. 10.5.1-10.5.4.

* cited by examiner

*Primary Examiner* — Kretelia Graham (57) ABSTRACT

A memory device has an SRAM that stores a logic state. A first MTJ has two terminals. A second one of the terminals is coupled to a storing node. A first terminal of a second MTJ is coupled to the storing node. The first and second MTJs are programmed to a first resistance by flowing current from the first second terminals and to a second resistance by flowing current from the second to first terminal. A storing circuit is coupled to the storing node, the SRAM cell, and a non-volatile word line. The storing circuit couples the logic state of the SRAM cell to the storing node during a store mode. The logic state of the SRAM cell is stored in the first and second MTJs by applying a storing voltage between the first terminal of the first MTJ and the second terminal of the second MTJ of a first polarity then a second polarity.

17 Claims, 5 Drawing Sheets

SYSTEMS AND METHODS FOR SRAM WITH BACKUP NON-VOLATILE MEMORY THAT INCLUDES MTJ RESISTIVE ELEMENTS

BACKGROUND

Field

This disclosure relates generally to semiconductor memory devices, and more specifically, to static random access memory (SRAM) with backup non-volatile memory that includes magnetic tunneling junction (MTJ) resistive elements.

Related Art

Memories with resistive storage elements under development across the semiconductor industry are geared to replace conventional random access memory (RAM) and non-volatile memory devices. The resistive memory devices include magnetoresistive random access memory (MRAM), Resistive random-access memory (RRAM or ReRAM), and phase-change memory (PCM), among others. Most of the resistive memory devices are implemented in one transistor/one resistive element or one diode/one resistive element memory cell configurations, which require minimal cell area but exhibit relatively slow read and write performance (e.g., approximately 30 nanoseconds or more per operation). Thus, resistive memory devices are not a viable substitute for much of the static RAM in a higher performance system where read/write operations occur within a few clock cycles. It is also difficult to produce a reliable one transistor/one resistive element or one diode/one resistive element memory.

Memory cells with one transistor and one resistive element may eventually replace embedded flash on future SoCs, but it is desirable to use these same elements to replace the static random access memory (SRAM) as well. Potentially, less flash would be needed, or the system could use a more efficient architecture, if the 'fast' memory such as SRAM was also compact and non-volatile.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Systems and methods disclosed herein provide a memory device with six transistor static random access memory (SRAM) cells coupled to one-transistor-one resistor magnetic memory cells (MMC). In one embodiment, one inverter/access transistor combination on one side of the SRAM cell is sized by a factor of 2-5 times the other side of the SRAM. The inverters of the SRAM have complementary functions. One inverter is used to store the SRAM data to the MMC and the other inverter is used to enable restore of MMC data to the SRAM. During the store of the SRAM data the inverter writing the data has to be strong enough to provide the write current, while during the restore of the MMC data to the SRAM the other inverter pullup (PMOS) transistor should be weak enough to the overcome by the pulldown (NMOS) transistor driven by the MMC data. In another embodiment, the transistors in each side of the SRAM cell are the same size, but additional transistors are included in the MMC to provide an independent current path to program the MMC. In each embodiment, the data in each of the SRAM cells is stored in a corresponding one of the MMCs in the background, which means that the state of the SRAM cell does not need to be read before copying the data to the MMC. The data in the MMCs can be copied to the SRAM cells when a restore operation is performed, such as during power-up, reset, or other suitable situations.

Figure 1:
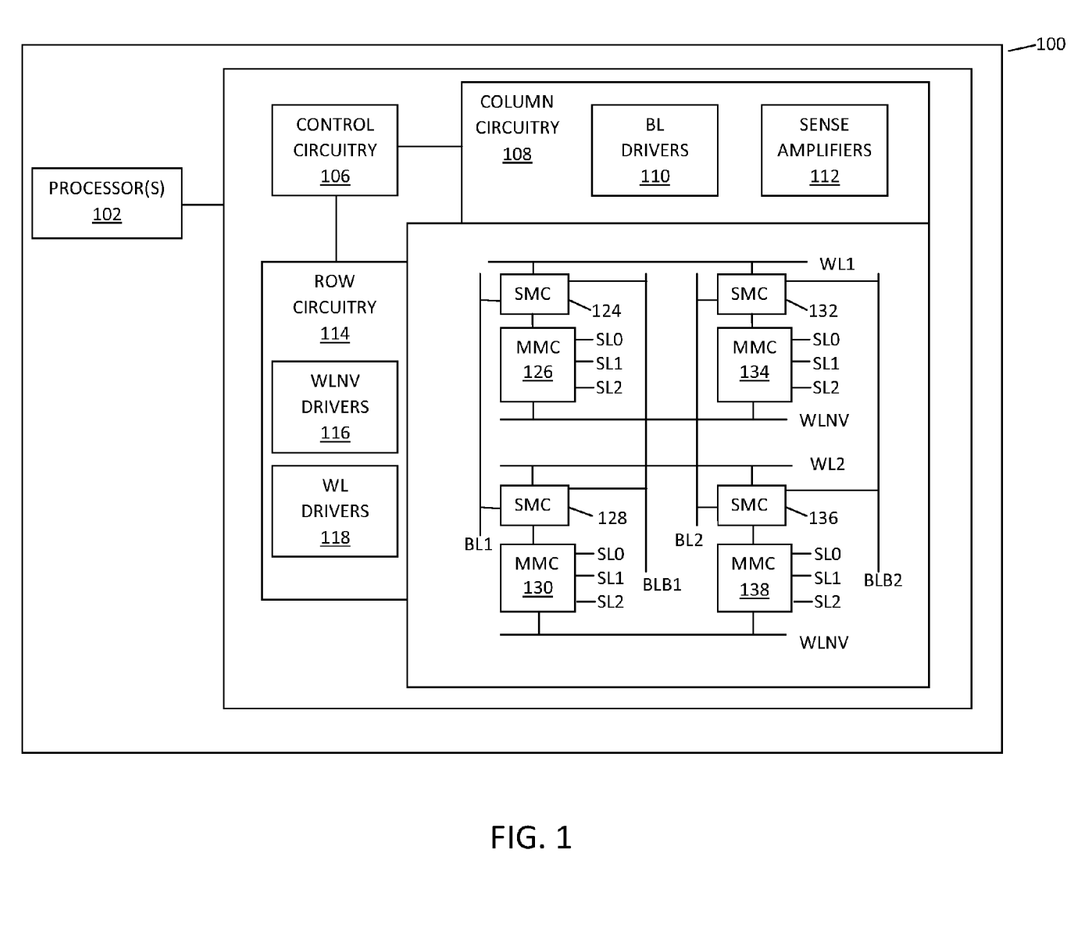
FIG. 1 illustrates a block diagram of an embodiment of a processing system that includes a memory device with SRAM cells coupled to backup non-volatile memory with magnetic tunneling junction resistors.

FIG. 1 illustrates a block diagram of an embodiment of a processing system 100 that includes one or more processors 102, and memory device 104 with control circuitry, column circuitry 108 with bit line drivers 110 and sense amplifiers 112, row circuitry 114 with non-volatile word line drivers 116 and word line drivers 118, and memory array 122 with SRAM cells (SMCs)124, 128, 132, 136 coupled to respective backup non-volatile memory cells (MMCs) 126, 130, 134, 138 that include magnetic tunneling junction resistors.

Memory array 122 is coupled to column circuitry 108 and row circuitry 114. Row circuitry 114 and column circuitry 108 are coupled to control circuitry 106 and can receive addresses for read and write requests from computer processor(s) 102. Data to be written to memory array 104 is provided from a processor 102 to column circuitry 108. True bit lines BL1, BL2 and complementary bit lines BLB1, BLB2 are coupled between bit line drivers 110 and SMCs 124, 128, 132, 136. Word lines WL1, WL2 are coupled between word line drivers 118 and SMCs 124, 128, 132, 136. One or more non-volatile word lines NVWL are coupled between non-volatile word line drivers 116 and MMCs 126, 130, 134, 138. Control circuitry 106 or other suitable component can provide analog voltage source line signals SL0, SL1, SL2 to MMCs 126, 130, 134, 138

Control circuitry 106 controls program and erase procedures of the memory array 122 through row circuitry 114 and column circuitry 108, such as in response to requests from one or more processors 102. Data is read from the memory array 122 via column circuitry 108 by sensing voltage levels on bit lines BL1, BL2, BLB1, BLB2, which are coupled between memory array 122 and sense amplifiers 112. Sense amplifiers 112 provide data (DATA0, DATA1) from respective columns of data in memory array 122 to one or more processors 102.

Row circuitry 114 provides a row address that is used to select one row of memory array 122 for read or write operations. A power supply voltage VDD is also conducted on word lines WL1 to WL2 and non-volatile word line WLNV. VDD can be any suitable voltage. Column circuitry 108 receives a column address and includes a plurality of input/output (I/O) terminals for receiving or providing data signals. As illustrated in FIG. 1, bit lines run in the column direction, and the word lines run in the row direction.

Although memory array 122 is shown with four SMC 124, 128, 132, 136, four MMCs 126, 130, 134, 138, two word lines (WL1, WL2), one non-volatile word line (WLNV), two true bit lines (BL1, BL2), and two complementary bit lines (BLB1, BLB2), memory device 104 can include any suitable number of memory cells, word lines, non-volatile bit lines and true and complementary bit lines. Processing system 100 can be implemented using CMOS (complementary metal-oxide semiconductor) transistors as a System On Chip (SOC) or other integrated circuit device which includes at least one processor 102 coupled to memory device 104 via an appropriate interface (not shown), such as a bus or the like with multiple signals or bits. The integrated circuit device may include other circuits, modules or devices, such as other memory devices (not shown), other functional modules (not shown), and external interfaces, such as input, output or input/output (I/O) ports or pins or the like (not shown). In one alternate embodiment, memory device 104 is implemented alone in an integrated circuit without any other devices. In another alternative embodiment, memory device 104 is part of a larger system on the integrated circuit. Additionally, SMCs 124, 128, 132, 136 can all be implemented with similar components, such as shown for example in FIGS. 2 and 4. Likewise, MMCs 126, 130, 134, 138 can all be implemented with similar components, such as shown for example in FIGS. 2 and 4. MMCs 126, 130, 134, 138 are coupled to one or more data nodes of SMCs 124, 128, 132, 136, such as also shown for example in FIGS. 2 and 4.

Figure 2:
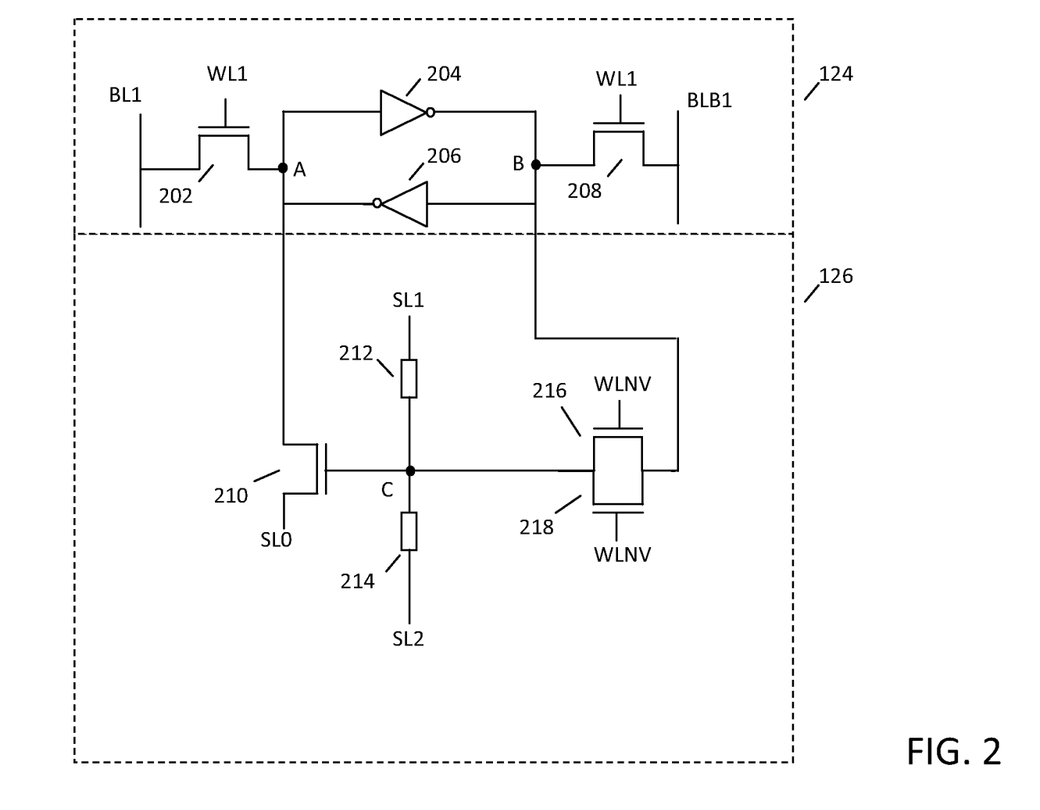
FIG. 2 illustrates a block diagram of an embodiment of an SRAM cell and an MTJ memory cell that can be used in the memory device of FIG. 1.

FIG. 2 illustrates a block diagram of an embodiment of SRAM cell (SMC) 124 and an MTJ memory cell (MMC) 126 that can be used in the memory device of FIG. 1. Memory cell 124 includes a pair of cross-coupled inverters 204, 206 with the output of inverter 204 coupled to the input of inverter 206 and the output of inverter 206 coupled to the input of inverter 204. Node A is coupled between the input of inverter 204 and the output of inverter 206. Node B is coupled between the input of inverter 206 and the output of inverter 204. Data is retained at storage nodes A and B by the reinforcing states of inverters 204, 206, that is, the output of inverter 204 is opposite the output of inverter 206, so inverters 204, 206 reinforce the state of one another. Memory cell 124 also includes pass transistors 202, 208 to allow access to read or write data on storage nodes A, B and controlling the states of inverters 204, 206 to retain the data while power is provided to SMC 124.

Word line WL1 is coupled to control gates of pass transistors 202, 208. True bit line BL1 is coupled to a first current electrode of transistor 202 and a second current electrode of transistor 202 is coupled to node A. Complementary bit line BLB1 is coupled to a first current electrode of transistor 208 and a second current electrode of transistor 208 is coupled to node B.

MMC 126 includes read transistor 210, magnetic tunnel junction (MTJ) resistive elements 212, 214, and write transistors 216, 218. Read transistor 210 includes a first current electrode coupled to node A, a second current electrode coupled to source line signal SL0 and a control electrode coupled to node C. A first terminal of MTJ resistive element 212 is coupled to source line signal SL1 and a second terminal of MTJ resistive element 212 is coupled to node C. A first terminal of MTJ resistive element 214 is coupled to node C and a second terminal of MTJ resistive element 214 is coupled to source line signal SL2. A first current electrode of transistor 216 is coupled to a first current electrode of transistor 218. The first current electrodes of transistors 216, 218 are also coupled to node C. A second current electrode of transistor 216 is coupled to a second current electrode of transistor 218. The second current electrodes of transistors 216, 218 are also coupled to node B of SMC 124. Control electrodes of transistors 216, 218 are coupled to non-volatile word line WLNV.

During normal operation, SMC 124 is isolated from MMC 126 by allowing source line signal SL0 to float and holding non-volatile word line (WLNV) and source line signals SL1 and SL2 at zero (0) volts. SMC 124 operates as a normal SRAM cell while isolated from MMC 126 during read and program operations by applying suitable voltages at word line WL1, true bit line BL1, and complementary bit line BLB1. Transistors in inverter 204 and transistor 208 on one side of SMC 124 can be 2 to 5 times the size of corresponding transistors in inverter 206 and transistor 202 in the other side of SMC 124. Resistive elements 212, 214 are coupled in series and provide a resistance ratio, which, in conjunction with the asymmetry in transistor sizes in inverter 204 and transistor 208, helps drive pulldown transistor 210 against a pull-up transistor in inverter 206 during restore and in a complementary way help the transistors in inverter 204 provide the required write current to the MMC 126. Transistors 202, 208, 210, 216, 218 are shown as n-channel transistors, however transistors of opposite polarities can be used with corresponding changes to SMC 124 and MMC 126.

Figure 3:
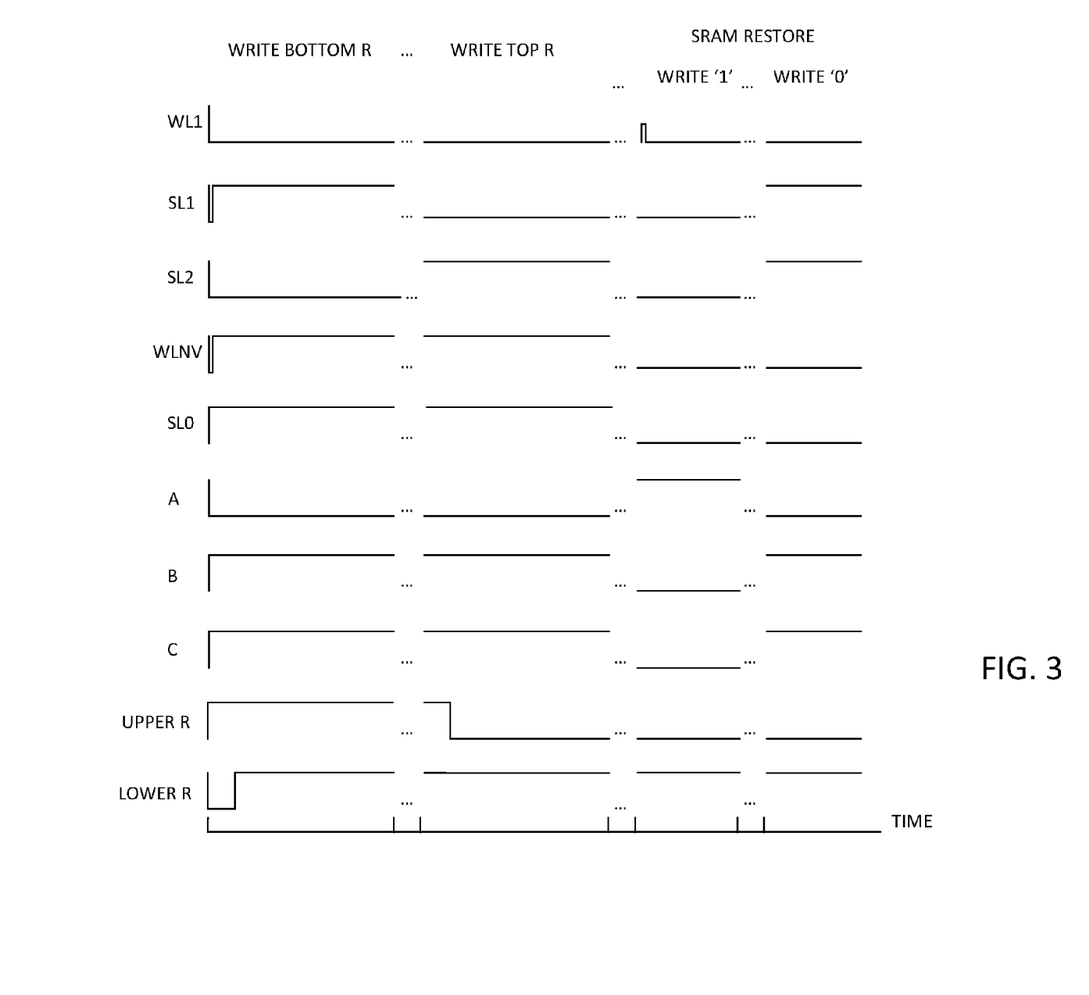
FIG. 3 illustrates a timing diagram showing the state of various signals in the memory device of FIG. 2 during different stages of operation.

When power is removed from SMC 124, data stored at nodes A and B will be lost unless the data was previously stored in the resistors 212 and 214 in MMC 126. Referring to FIGS. 2 and 3, FIG. 3 illustrates a timing diagram showing the state of various signals in the memory device 104 of FIG. 2 during different stages of operation including writing data from SMC 124 to MMC 126, restoring a "1" stored in MMC 126 to SMC 124, and restoring a "0" stored in MMC 126 to SMC 124.

To save or copy data in volatile SMC 124 to non-volatile MMC 126, control circuitry 106 or other suitable logic issues commands or requests to row circuitry 114 and column circuitry 108 to copy data from SMC 124 to MMC 126. Row circuitry 114 and column circuitry 108 then provide the corresponding signals and voltages to perform the operation. As shown in FIG. 3 as an example, to transfer data from SMC 124 to MMC 126, the upper resistive element 212 and bottom resistive element 214 are programmed one at a time. To write or program bottom resistive element 214, word line WL1 is low, non-volatile word line WLNV is set high, source line signal SL0 is at high impedance, source line signal SL1 transitions to high, and source line signal SL2 is low. Node A is at a low state and node B is at a high state. Node C transitions from a low to a high state once the non-volatile word line WLNV is set to place transistors 216, 218 in conductive state. Upper resistive element 212 remains in a high resistance state and bottom resistive element 214 transitions from a low to a high resistance state once current through bottom resistive element 214 reaches a value that is sufficient to cause resistive element 214 to change states.

Once the bottom resistive element 214 is written, upper resistive element 212 is written by leaving word line WL1 low, non-volatile word line WLNV high, and source line signal SL0 at high impedance. Source line signals SL1 and SL2 are set to opposite states, with source line signal SL1 being set low, and source line signal SL2 being set high. Node A remains at a low state and nodes B and C remain at a high state. Bottom resistive element 214 remains in a high resistance state and upper resistive element 212 transitions from a high to a low resistance state once current through upper resistive element 212 reaches a value that is sufficient to cause upper resistive element 212 to change to a low resistance state.

Data being stored in non-volatile MMC 126 can also be transferred to SMC 126 using a restore operation that operates in parallel between SMC 126 and MMC 124. At the beginning of the restore operation, BL1 is held high, BLB1 is held low and word line WL1 is pulsed high to write a "1" to SMC 124 whereby node B transitions low thereby setting node A high. A read pulse is applied to source line signal SL1 at a read supply voltage, and a voltage that is lower than the read supply voltage, such as ½ read supply voltage, is applied to source line signal SL2. Zero volts are applied to source line SL0. If MMC 126 is storing a "0", resistive element 212 is in a low resistance state and resistive element 214 is in a high resistance state. Read transistor 210 is in conductive mode due to node C being high. This causes node A to discharge through transistor 210, and the data in SMC 124 changes from "1" to "0". Alternatively, if MMC 126 is storing a "1", resistive element 212 is in a high resistance state and resistive element 214 is in a low resistance state. Read transistor 210 is in non-conductive mode due to node C being low. This causes node A to remain charged and SMC 124 holds data of "1".

Figure 4:
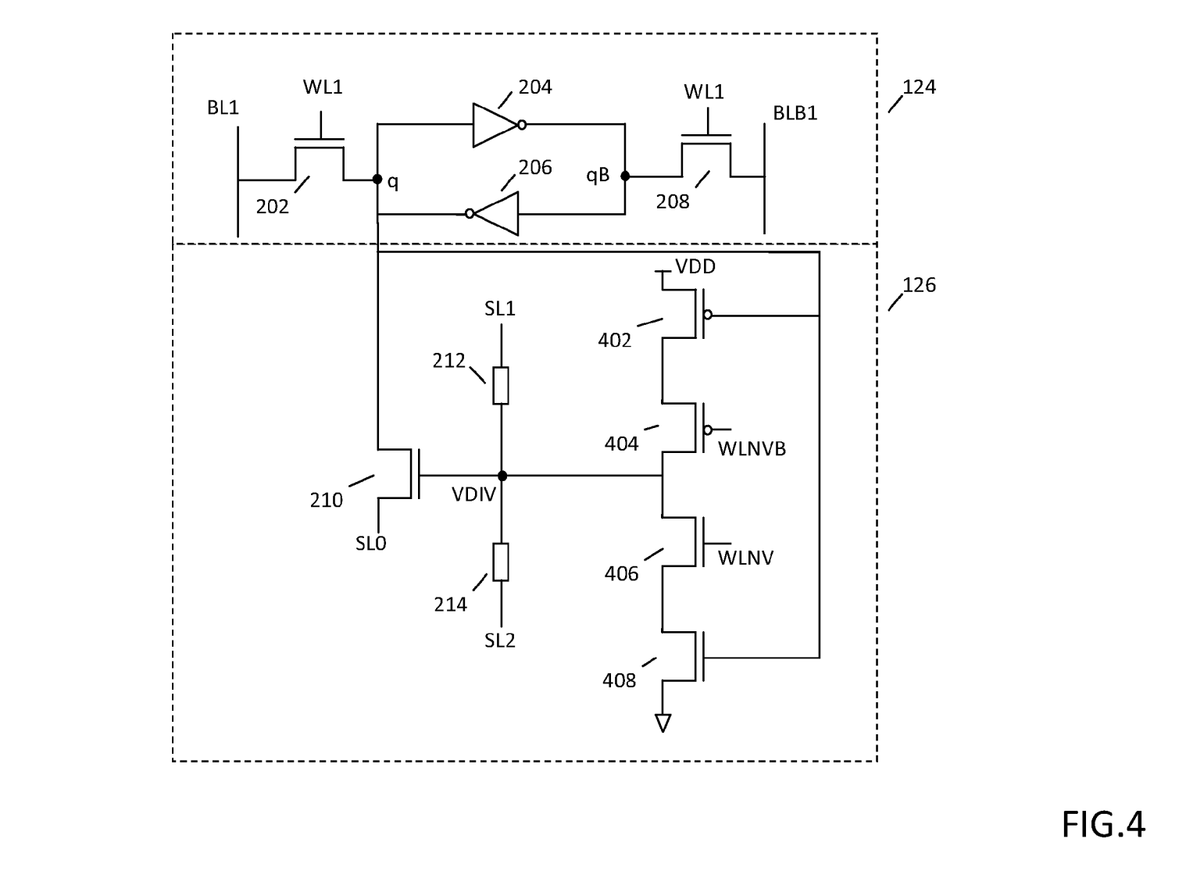
FIG. 4 illustrates a block diagram of another embodiment of an SRAM cell and an MTJ memory cell that can be used in the memory device of FIG. 1.

FIG. 4 illustrates a block diagram of another embodiment of SRAM cell (SMC) 124 and an MTJ memory cell (MMC) 126 that can be used in the memory device of FIG. 1. Memory cell 124 includes a pair of cross-coupled inverters 204, 206 with the output of inverter 204 coupled to the input of inverter 206 and the output of inverter 206 coupled to the input of inverter 204. Node q is coupled between the input of inverter 204 and the output of inverter 206. Node qB is coupled between the input of inverter 206 and the output of inverter 204. Data is retained at storage nodes q and qB by the reinforcing states of inverters 204, 206, that is, the output of inverter 204 is opposite the output of inverter 206, so inverters 204, 206 reinforce the state of one another. Memory cell 124 also includes pass transistors 202, 208 to allow access to read or write data on storage nodes q, qB while power is provided to SMC 124.

Word line WL1 is coupled to control gates of pass transistors 202, 208. True bit line BL1 is coupled to a first current electrode of transistor 202 and a second current electrode of transistor 202 is coupled to node q. Complementary bit line BLB1 is coupled to a first current electrode of transistor 208 and a second current electrode of transistor 208 is coupled to node qB.

MMC 126 includes read transistor 210, magnetic tunnel junction (MTJ) resistive elements 212, 214, and write transistors 402, 404, 406, 408. Read transistor 210 includes a first current electrode coupled to node A, a second current electrode coupled to source line signal SL0 and a control electrode coupled to node VDIV. A first terminal of MTJ resistive element 212 is coupled to source line signal SL1 and a second terminal of MTJ resistive element 212 is coupled to node VDIV. A first terminal of MTJ resistive element 214 is coupled to node VDIV and a second terminal of MTJ resistive element 214 is coupled to source line signal SL2.

Transistor 402 has a first current electrode coupled to a supply voltage, such as VDD, a second current electrode coupled to a first current electrode of transistor 404, and a control electrode coupled to node q. Transistor 404 has a first current electrode coupled to the second current electrode of transistor 402, a second current electrode coupled to a first current electrode of transistor 406, and a control electrode coupled to a complement of a non-volatile word line (WL-NVB). Transistor 406 has a first current electrode coupled to the second current electrode of transistor 404, a second current electrode coupled to a first current electrode of transistor 408, and a control electrode coupled to non-volatile word line (WLNV). The second current electrode of transistor 404, and the first current electrode of transistor 406 are also coupled to node VDIV. Transistor 408 has a first current electrode coupled to the second current electrode of transistor 406, a second current electrode coupled to a supply voltage, such as VSS or ground, and a control electrode coupled to node q. Transistors 202, 208, 210, 406, 408 are shown as n-channel transistors and transistors 402, 404 are shown as p-channel transistors, however transistors of opposite polarities can be used with corresponding changes to SMC 124 and MMC 126.

During normal operation, SMC 124 is isolated from MMC 126 by allowing source line signal SL0 to float and holding non-volatile word line (WLNV) and source line signals SL1 and SL2 at zero (0) volts. SMC 124 operates as a normal SRAM cell during read and program operations while isolated from MMC 126 by applying suitable voltages at word line WL1, true bit line BL1, and complementary bit line BLB1. Transistors in inverter 204 and transistor 208 on one side of SMC 124 can be the same size as corresponding transistors in inverter 206 and transistor 202 in the other side of SMC 124. During the restore operation, resistive elements 212, 214 are coupled in series and provide a resistance ratio, which, in conjunction with transistor 210, helps drive down node q against a pull-up transistor in inverter 206.

Figure 5:
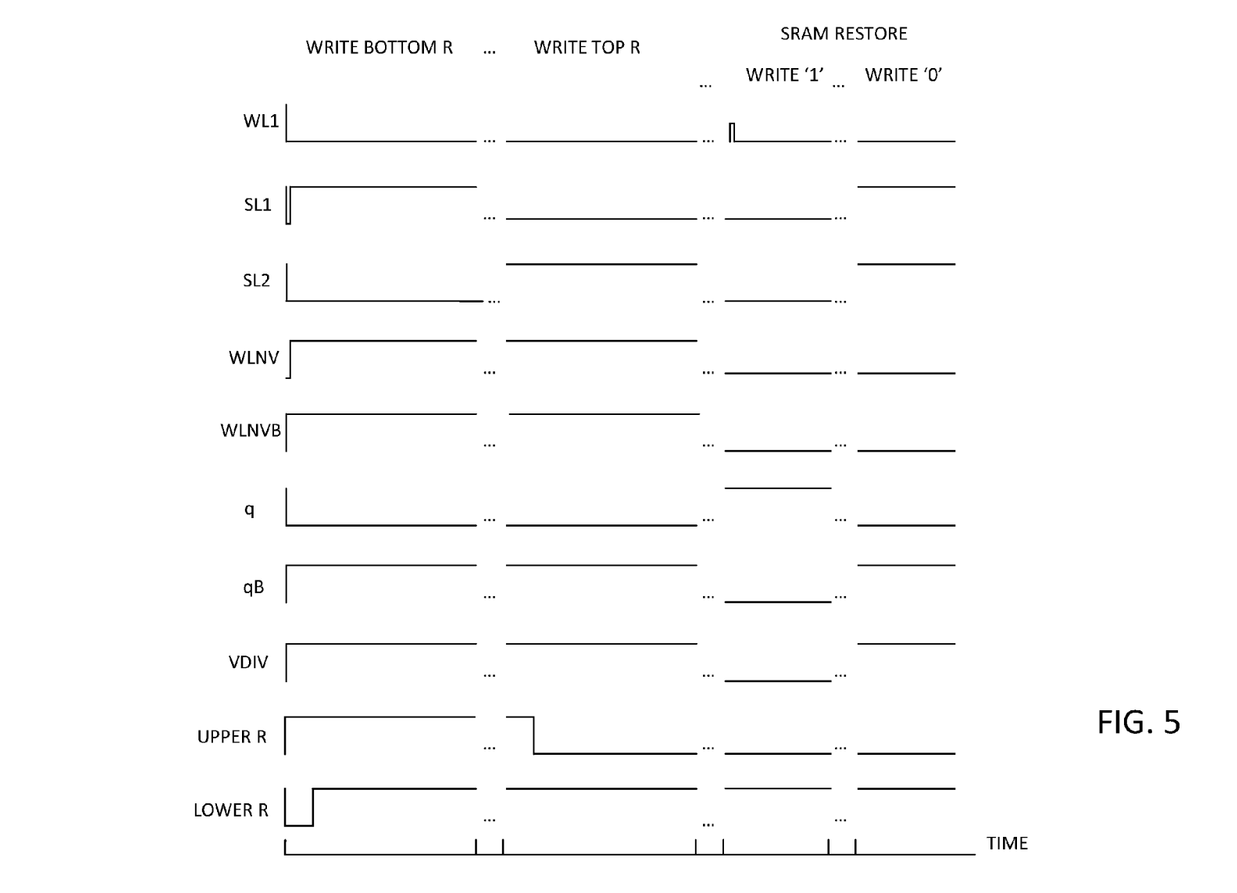
FIG. 5 illustrates a timing diagram showing the state of various signals in the memory device of FIG. 4 during different stages of operation.

When power is removed from SMC 124, data stored at nodes q and qB will be lost unless the data was previously stored in the resistors 212 and 214 in MMC 126. Referring to FIGS. 4 and 5, FIG. 5 illustrates a timing diagram showing the state of various signals in SMC 124 and MMC 126 of FIG. 4 during different stages of operation including writing data from SMC 124 to MMC 126, conditioning SMC 124 by writing a "1", and restoring a "0" stored in MMC 126 to SMC 124.

To save or copy data in volatile SMC 124 to non-volatile MMC 126, control circuitry 106 or other suitable logic issues commands or requests to row circuitry 114 and column circuitry 108 to copy data from SMC 124 to MMC 126. Row circuitry 114 and column circuitry 108 then provide the corresponding signals and voltages to perform the operation. As shown in FIG. 5 as an example, to transfer data from SMC 124 to MMC 126, the upper resistive element 212 and bottom resistive element 214 are programmed one at a time. To write or program bottom resistive element 214, word line WL1 is low, non-volatile word line WLNV is set high, complementary non-volatile word line WLNVB is set low, source line signal SL0 is at high impedance, source line signal SL1 transitions to high, and source line signal SL2 is low. Node q is at a low state and node qB is at a high state. Node VDIV transitions from a low to a high state once complementary non-volatile word line WLNVB is set to place transistor 404 in a conductive state and non-volatile word line WLNV is set to place transistor 406 also in a conductive state. The state q being low the transistor 408 is in a non-conductive state and transistor 402 is in a conductive state. Upper resistive element 212 remains in a high resistance state and bottom resistive element 214 transitions from a low to a high resistance state once current through bottom resistive element 214 reaches a value that is sufficient to cause resistive element 214 to change states.

Once the bottom resistive element 214 is written, upper resistive element 214 is written by leaving word line WL1 low, non-volatile word line WLNV high, complementary non-volatile word line WLNVB low, and source line signal SL0 at high impedance. Source line signals SL1 and SL2 are set to opposite states, with source line signal SL1 being set low, and source line signal SL2 being set high. Node q remains at a low state and nodes qB and VDIV remain at a high state. Bottom resistive element 214 remains in a high resistance state and upper resistive element 212 transitions from a high to a low resistance state once current through upper resistive element 212 reaches a value that is sufficient to cause upper resistive element 212 to change to a low resistance state.

Data being stored in non-volatile MMC 126 can also be transferred to SMC 126 using a restore operation that operates in parallel between SMC 126 and MMC 124. At the beginning of the restore operation, BL1 is held high, BLB1 is held low and the word line WL1 is pulsed to write a "1" to SMC 124 whereby node qB transitions low whereby setting node q high. A read pulse is applied to source line signal SL1 at a read supply voltage, and a voltage that is lower than the read supply voltage, such as ½ read supply voltage, is applied to source line signal SL2. Zero volts are applied to source line SL0. If MMC 126 is storing a "0", resistive element 212 is in a low resistance state and resistive element 214 is in a high resistance state. Read transistor 210 is in conductive mode due to node VDIV being high. This causes node q to discharge through transistor 210, and the data in SMC 124 changes from "1" to "0". Alternatively, if MMC 126 is storing a "1", resistive element 212 is in a high resistance state and resistive element 214 is in a low resistance state. Read transistor 210 is in non-conductive mode due to node VDIV being low. This causes node q to remain charged and SMC 124 holds data of "1".

Alternately, instead of applying complementary voltages to SL1 and SL2 as shown in FIGS. 3 and 5, SL1 and SL2 may be pulsed together low then high. In this alternate embodiment, during one pulse neither resistor 212 or 214 changes state, but during the other pulse both resistors 212 and 214 change state.

By now it should be appreciated that in some embodiments, there has been provided a memory device, (124, 126) that has an SRAM (124) that stores a logic state. A first MTJ (212) has two terminals. A second one of the terminals is coupled to a storing node (C). A first terminal of a second MTJ is coupled to the storing node. The first and second MTJs are programmed to a first resistance by flowing current from the first second terminals and to a second resistance by flowing current from the second to first terminal. A storing circuit (216/218 or 402, 404, 406, 408) is coupled to the storing node, the SRAM cell, and a non-volatile word line (WLNV). The storing circuit couples the logic state of the SRAM cell to the storing node during a store mode. The logic state of the SRAM cell is stored in the first and second MTJs by applying a storing voltage between the first terminal of the first MTJ and the second terminal of the second MTJ of a first polarity then a second polarity.

In another aspect, the storing circuit can comprise a first transistor (216/218) having a control electrode coupled to the non-volatile word line, a first current electrode coupled to the storing node, and a second current electrode coupled to the SRAM cell.

In another aspect, the SRAM cell can be further characterized as having a first storage node (A) and a second storage node (B) and wherein the second current electrode of the first transistor is coupled to the second storage node.

In another aspect, the memory device can further comprise a restore circuit (210) having an input coupled to the storing node and an output coupled to the first storage node.

In another aspect, the restore circuit can comprise a second transistor (210) having a control electrode coupled to the storing node, a first current electrode coupled to the first storage node, and a second current electrode coupled to a reference voltage.

In another aspect, the SRAM cell can comprise a first pass gate (202) coupled to a first bit line (BL1) and the first storage node (A), a second pass gate (208) coupled to a second bit line (BLB1) and the second storage node (B), a first inverter (204) having an input coupled to the first storage node and an output coupled to the second storage node, and a second inverter (206) having an input coupled to the second storage node and an output coupled to the first storage node, wherein the second pass gate is larger than the first pass gate and the first inverter is larger than the second inverter.

In another aspect, the first transistor can be implemented as two transistors in parallel.

In another aspect, the storing circuit can comprise a first P channel transistor (404) having a control electrode coupled to a complementary non-volatile word line, a second (402) P channel transistor having a control electrode coupled to the SRAM cell, a first N channel transistor (406) having a control electrode coupled to the non-volatile word line, and a second N channel transistor (408) having a control electrode coupled to the SRAM cell. The first and second P channel transistors are coupled in series between a positive power supply terminal and the storing node. The first and second N channel transistors are coupled in series between a negative power supply terminal and the storing node.

In another aspect, the negative power supply terminal can comprise a ground terminal.

In another aspect, the SRAM cell can be further characterized as having a first storage node (A) and a second storage node (B) and wherein the control electrodes of the second P channel transistor and the second N channel transistor are coupled to the first storage node.

In another aspect, the memory device can further comprise a restore circuit (210) having an input coupled to the storing node and an output coupled to the first storage node.

In another aspect, the restore circuit can comprise a data transistor (210) having a control electrode coupled to the storing node, a first current electrode coupled to the first storage node, and a second current electrode coupled to a reference voltage.

In another aspect, the SRAM cell can comprise a first pass gate (202) coupled to a first bit line (BL1) and the first storage node (A), a second pass gate (208) coupled to a second bit line (BLB1) and the second storage node (B), a first inverter (204) having an input coupled to the first storage node and an output coupled to the second storage node, and a second inverter (206) having an input coupled to the second storage node and an output coupled to the first storage node, wherein the first and second pass gates are the same size and the first and second inverters are the same size.

In another embodiment, a method of operating a memory device is provided. The memory device can comprise an SRAM cell (124) that stores a logic state, a first MTJ (212) having a first terminal and a second terminal coupled to a storing node (C), a second MTJ (214) having a first terminal and a second terminal, wherein the first terminal of the second MTJ is coupled to the storing node, and wherein the first and second MTJs are characterized as being programmed to a first resistance state by flowing current from the first terminal to the second terminal and to a second resistance state, different from the first resistance state, by flowing current from the second terminal to the first terminal. The method can comprise coupling the logic state of the SRAM cell to the storing node during a store mode, and applying a storing voltage between the first terminal of the first MTJ and the second terminal of the second MTJ of a first polarity during a first time period and a second polarity during a second time period.

In another aspect, the memory device can be further characterized by the SRAM cell storing a true logic state and a complementary logic state, the method can be further characterized by coupling the true logic from the SRAM cell to the storing node.

In another aspect, the memory device can be further characterized by the SRAM cell storing a true logic state and a complementary logic state, and the method can be further characterized by inverting the complementary logic and coupling the inverted complementary logic state to the storing node.

In another aspect, inverting the complementary logic and coupling the inverted complementary logic state to the storing node can result in providing a buffered signal to the storing node.

In another aspect, the method can further comprise restoring a logic state present on the storing node to the SRAM cell by writing a predetermined logic state into the SRAM cell and coupling a storage node of the SRAM cell to a reference voltage if the logic state of the storing node is different from the predetermined logic state.

In another embodiment, a memory device can comprise an SRAM cell (124) that stores a logic state in a true storage node (A) and a complementary storage node (B), a first MTJ (212) having a first terminal and a second terminal coupled to a storing node (C), a second MTJ (214) having a first terminal and a second terminal. The first terminal of the second MTJ is coupled to the storing node. The first and second MTJs are characterized as being programmed to a first resistance state by flowing current from the first terminal to the second terminal and to a second resistance state, different from the first resistance state, by flowing current from the second terminal to the first terminal. A storing circuit (216/218 or 402, 404, 406, 408) is coupled to the storing node, to one of the group consisting of the true storage node and the complementary storage node, and a non-volatile word line (WLNV). The storing circuit couples the logic state of the SRAM cell to the storing node during a store mode by direct coupling when coupled to the true storage node and inverting when coupled to the complementary storage node. During the store mode, the logic state of the SRAM cell is stored in the first and second MTJs by applying a storing voltage between the first terminal of the first MTJ and the second terminal of the second MTJ of a first polarity during a first time period and a second polarity during a second time period.

In another aspect, the restore circuit can comprise a transistor (210) having a control electrode coupled to the storing node, a first current electrode coupled to the true storage node, and a second current electrode coupled to a reference voltage.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory device, comprising:
an SRAM cell that stores a logic state;
a first MTJ having a first terminal and a second terminal coupled to a storing node;
a second MTJ having a first terminal and a second terminal, wherein the first terminal of the second MTJ is coupled to the storing node, and
wherein the first and second MTJs are characterized as being programmed to a first resistance state by flowing current from the first terminal to the second terminal and to a second resistance state, different from the first resistance state, by flowing current from the second terminal to the first terminal;
a storing circuit coupled to the storing node, the SRAM cell, and a non-volatile word line, wherein the storing circuit couples the logic state of the SRAM cell to the storing node during a store mode, wherein the storing circuit comprises:
a first P channel transistor having a control electrode coupled to a complementary non-volatile word line;
a second P channel transistor having a control electrode coupled to the SRAM cell;
a first N channel transistor having a control electrode coupled to the non-volatile word line; and
a second N channel transistor having a control electrode coupled to the SRAM cell;
wherein:
the first and second P channel transistors are coupled in series between a positive power supply terminal and the storing node; and
the first and second N channel transistors are coupled in series between a negative power supply terminal and the storing node;
wherein, during the store mode, the logic state of the SRAM cell is stored in the first and second MTJs by applying a storing voltage between the first terminal of the first MTJ and the second terminal of the second MTJ of a first polarity during a first time period of a store operation and a second polarity during a second time period of the store operation.

2. The memory device of claim 1, wherein the storing circuit comprises a first transistor having a control electrode coupled to the non-volatile word line, a first current electrode coupled to the storing node, and a second current electrode coupled to the SRAM cell.

3. The memory device of claim 2, wherein the SRAM cell is further characterized as having a first storage node and a second storage node and wherein the second current electrode of the first transistor is coupled to the second storage node.

4. The memory device of claim 3, further comprising a restore circuit having an input coupled to the storing node and an output coupled to the first storage node.

5. The memory device of claim 4, wherein the restore circuit comprises a second transistor having a control electrode coupled to the storing node, a first current electrode coupled to the first storage node, and a second current electrode coupled to a reference voltage.

6. The memory device of claim 3, wherein the SRAM cell comprises a first pass gate coupled to a first bit line and the first storage node, a second pass gate coupled to a second bit line and the second storage node, a first inverter having an input coupled to the first storage node and an output coupled to the second storage node, and a second inverter having an input coupled to the second storage node and an output coupled to the first storage node, wherein the second pass gate is larger than the first pass gate and the first inverter is larger than the second inverter.

7. The memory device of claim 6, wherein the first transistor is implemented as two transistors in parallel.

8. The memory device of claim 1, wherein the negative power supply terminal comprises a ground terminal.

9. The memory device of claim 8, wherein the SRAM cell is further characterized as having a first storage node and a second storage node and wherein the control electrodes of the second P channel transistor and the second N channel transistor are coupled to the first storage node.

10. The memory device of claim 9, further comprising a restore circuit having an input coupled to the storing node and an output coupled to the first storage node.

11. The memory device of claim 10, wherein the restore circuit comprises a data transistor having a control electrode coupled to the storing node, a first current electrode coupled to the first storage node, and a second current electrode coupled to a reference voltage.

12. The memory device of claim 11, wherein the SRAM cell comprises a first pass gate coupled to a first bit line and the first storage node, a second pass gate coupled to a second bit line and the second storage node, a first inverter having an input coupled to the first storage node and an output coupled to the second storage node, and a second inverter having an input coupled to the second storage node and an output coupled to the first storage node, wherein the first and second pass gates are the same size and the first and second inverters are the same size.

13. A method of operating a memory device, wherein the memory device comprises
an SRAM cell that stores a logic state;
a first MTJ having a first terminal and a second terminal coupled to a storing node;
a second MTJ having a first terminal and a second terminal, wherein the first terminal of the second MTJ is coupled to the storing node, and
wherein the first and second MTJs are characterized as being programmed to a first resistance state by flowing current from the first terminal to the second terminal and to a second resistance state, different from the first resistance state, by flowing current from the second terminal to the first terminal;
the method comprising:
coupling the logic state of the SRAM cell to the storing node during a store mode;
applying a storing voltage between the first terminal of the first MTJ and the second terminal of the second MTJ of a first polarity during a first time period of a store operation and a second polarity during a second time period of the store operation; and
restoring a logic state present on the storing node to the SRAM cell by writing a predetermined logic state into the SRAM cell and coupling a storage node of the SRAM cell to a reference voltage if the logic state of the storing node is different from the predetermined logic state.

14. The method of claim 13, wherein the memory device is further characterized by the SRAM cell storing a true logic state and a complementary logic state, the method further characterized by coupling the true logic from the SRAM cell to the storing node.

15. The method of claim 13, wherein the memory device is further characterized by the SRAM cell storing a true logic state and a complementary logic state, the method further characterized by inverting the complementary logic and coupling the inverted complementary logic state to the storing node.

16. The method of claim 15, wherein the inverting the complementary logic and coupling the inverted complementary logic state to the storing node results in providing a buffered signal to the storing node.

17. A memory device, comprising:
an SRAM cell that stores a logic state in a true storage node and a complementary storage node;
a first MTJ having a first terminal and a second terminal coupled to a storing node;
a second MTJ having a first terminal and a second terminal, wherein the first terminal of the second MTJ is coupled to the storing node, and
wherein the first and second MTJs are characterized as being programmed to a first resistance state by flowing current from the first terminal to the second terminal and to a second resistance state, different from the first resistance state, by flowing current from the second terminal to the first terminal;
a storing circuit coupled to the storing node, to one of the group consisting of the true storage node and the complementary storage node, and a non-volatile word line, wherein the storing circuit couples the logic state of the SRAM cell to the storing node during a store mode by direct coupling when coupled to the true storage node and inverting when coupled to the complementary storage node;
a restore circuit including a transistor having a control electrode coupled to the storing node, a first current electrode coupled to the true storage node, and a second current electrode coupled to a reference voltage;
wherein, during the store mode, the logic state of the SRAM cell is stored in the first and second MTJs by applying a storing voltage between the first terminal of the first MTJ and the second terminal of the second MTJ of a first polarity during a first time period of a store operation and a second polarity during a second time period of the store operation.

\* \* \* \* \*